United States Patent [19]

Sigel et al.

[11] 4,283,845

[45] Aug. 18, 1981

[54] APPARATUS FOR POSITIONING ELECTRICAL COMPONENTS RELATIVE TO A CARRIER

[75] Inventors: Pierre L. Sigel, Villeneuve-le-Roi; Raymond L. Delorme, Bagnolet; Henri Grosjean, Le Plessis Trevise, all of France

[73] Assignee: Compagnie Internationale pour l'Informatique CII-Honeywell Bull (Societe Anonyme), Paris, France

[21] Appl. No.: 917,279

[22] Filed: Jun. 20, 1978

[30] Foreign Application Priority Data

Jul. 4, 1977 [FR] France .................................. 77 20466

[51] Int. Cl.³ ............................................. B23P 19/00
[52] U.S. Cl. ........................................ 29/739; 29/740; 29/743
[58] Field of Search ............... 29/628, 626, 739, 741, 29/740, 714, 753, 465, 467, 466, 407; 269/73; 198/472, 434; 33/184.5

[56] References Cited

U.S. PATENT DOCUMENTS

| | | | |
|---|---|---|---|
| 2,418,754 | 4/1947 | Brunet | 33/184.5 |
| 2,845,859 | 8/1958 | Gattuso | 198/434 X |
| 3,400,031 | 9/1968 | Crathern | 29/407 X |
| 3,581,375 | 6/1971 | Rottman | 29/740 X |
| 4,079,489 | 3/1978 | Kowalski et al. | 29/740 X |
| 4,116,348 | 9/1978 | Atchley et al. | 29/740 X |

*Primary Examiner*—Nicholas P. Godici
*Assistant Examiner*—C. J. Arbes
*Attorney, Agent, or Firm*—Kerkam, Stowell, Kondracki & Clarke

[57] ABSTRACT

A positioning system for electrical components to be mounted on a carrier includes establishing a first reference system and bringing the carrier on which the components are to be mounted to a predetermined position in relation to the first system. The locations for the articles to be mounted on the carrier are defined. A second reference system is established with respect to the first reference system and the carrier is positioned in relation to the articles to be mounted on the carrier using the second reference system. Each reference system is defined by at least three fixed points against which the carrier comes to bear and the points of the second reference system duplicate the points of the first reference system so that the carrier is in the exact position to enable the components to be mounted at the exact predetermined location.

6 Claims, 3 Drawing Figures

APPARATUS FOR POSITIONING ELECTRICAL COMPONENTS RELATIVE TO A CARRIER

BACKGROUND OF THE INVENTION

This invention relates in general to a method and an apparatus for positioning articles, such as electrical and electronic components for example, relative to a carrier so that they can be laid down or mounted and attached at predetermined locations on the carrier, and it is particularly applicable to automatic machines for fitting electrical or electronic components which are used in the electronics industry, in watch and clock making, and in general in other technical fields where articles need to be laid down and attached automatically or semi-automatically with a high degree of accuracy at predetermined locations on a carrier of any kind.

The invention is applicable in particular to the mounting and attachment of electronic components, such as integrated circuits, which may or may not be enclosed in housings and which have a number of output conductors along one or more of their sides. The size of these components is generally very small, being of the order of a few millimeters, and it is therefore necessary, when they are laid down on and connected to a printed circuit board for example, that this be done with great accuracy.

SUMMARY OF THE INVENTION

The invention in its preferred embodiment provides a method of positioning articles, such as electrical or electronic components for example, relative to a carrier so that they can be laid down or mounted and attached at predetermined locations on the carrier, which method includes the steps of setting up the carrier in a predetermined position relative to a first reference system, defining the locations for the said articles on the carrier in relation to the first reference system, then moving the carrier to bring it substantially opposite the said articles, which are situated in predetermined positions, and positioning the carrier accurately in relation to the said articles using a second reference system, so that the articles can then be laid down and attached at their said locations on the carrier.

In accordance with the present invention, the first and second reference systems are each defined by at least three fixed points against which the lateral edges of the carrier come to bear, and the fixed points of the second reference system exactly duplicate the fixed points of the first reference system.

This gives an assurance that the articles and the predetermined locations for them on the carrier can be made to correspond exactly, or in other words that the articles can be exactly aligned with the predetermined locations for them on the carrier.

The invention also provides an apparatus for putting this method into effect, which is characterized in that it comprises first means to bring the carrier to a predetermined position in relation to a first reference system, second means to define on the carrier, when it is in this position, the locations for the articles to be laid down or mounted, means for placing the articles to be mounted in predetermined positions, and a second reference system which enables the carrier to be positioned in relation to the said articles in such a way that the articles are then exactly opposite the predetermined locations for them on the carriers.

In accordance with the present invention, the first means comprise at least three fixed abutments which define the first reference system and against which the lateral edges of the carrier come to bear, and the second reference system is absolutely identical with the first reference system.

BRIEF DESCRIPTION OF THE DRAWINGS

The invention will be better understood, and its objects, features, details and advantages will be more clearly apparent, from the following description, which is given with reference to the accompanying schematic drawings which appear solely by way of example to illustrate a preferred embodiment of the invention and in which.

DESCRIPTION OF THE PREFERRED EMBODIMENTS

Figure 1:
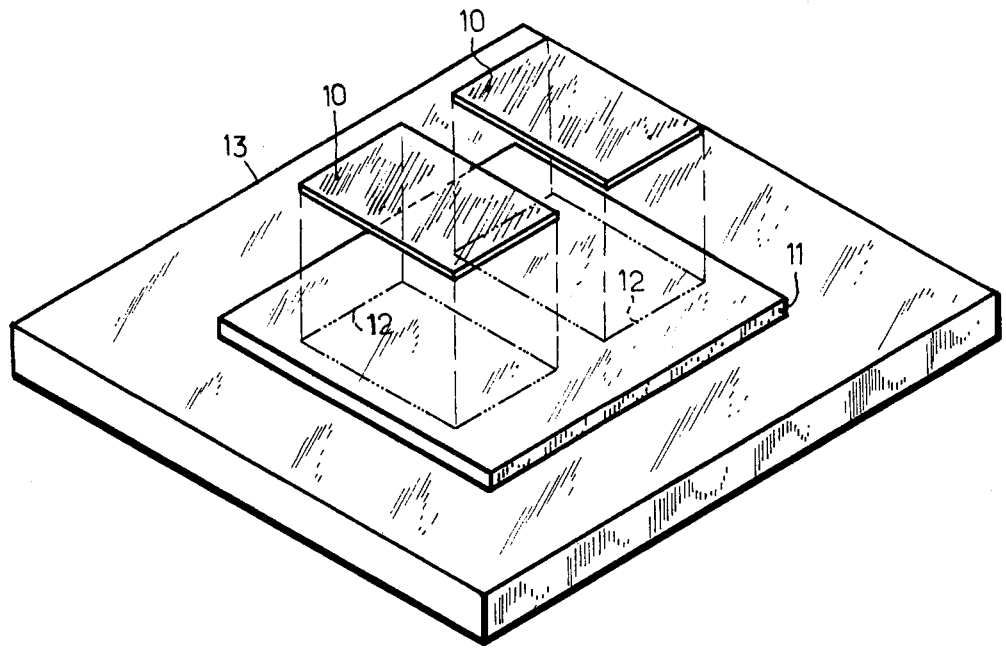
FIG. 1 is a schematic view of the positioning of two articles in relation to predetermined locations for them on a carrier.

FIG. 1 is a schematic view showing the principle on which a carrier is positioned in relation to articles which are to be mounted on and attached to it.

The articles to be mounted on the carrier are indicated by the reference numeral 10, the carrier is indicated by reference numeral 11 and the predetermined locations for the articles on carrier 11 are shown in chain lines and are indicated by reference number 12. The carrier 11 is situated on a table 13 or some equivalent means of support.

When the articles 10 are electrical or electronic components, they may have output conductors along one or more of their sides and these output conductors will need to be soldered to output conductors which are provided on the carrier 11 in the vicinity of the locations 12. The carrier 11 may be formed by a printed circuit board or may carry a printed circuit on one of its faces.

The articles 10 are very often mounted on the carriers 11 by means of automatic or semi-automatic machines and it is a fundamental necessity that the articles be positioned relative to the carrier and to their predetermined locations as accurately as possible, the permitted tolerance on accuracy being very much less than a millimeter, being for example of the order of a tenth or a hundredth of a millimeter and possibly even as little as a few microns.

Figure 2:
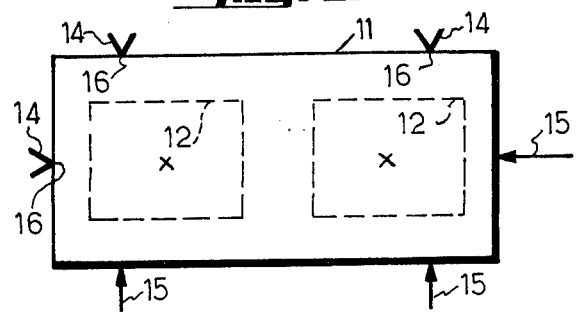
FIG. 2 is a schematic view of a first stage of the method according to the invention, consisting in setting up the carrier in relation to a first reference system and in determining the locations for the articles in relation to this first reference system.

To this end, the invention first of all makes provision for positioning the carrier 11 accurately in relation to a first reference system, which is defined in the present case by three fixed points which are shown schematically in FIG. 2 and indicated by references 14. These three fixed points 14 are not aligned with one another and thus define, in conjunction with a plane reference surface on which the carrier 11 is laid, a first reference system. Means which are not shown in FIG. 2 but which are represented by force lines or arrows 15 enable the carrier 11 to be pushed towards the three fixed points 14, so that the lateral edges of the carrier bear against the three points 14 as shown. The action of these means is indicated schematically by arrows 15.

When the carrier 11 is thus in a closely defined position in relation to the first reference system formed by the three fixed points 14, the locations 12 which are to be occupied by the articles 10 are defined on the surface of the carrier 11. It is of considerable importance that the locations 12 be defined with accuracy in relation to the first reference system formed by the three points 14. When this is effected, the relative positions of the locations 12 and three points 16 on the lateral edges of the carrier 11 are also defined.

It is also evident that this defining of relative positions could be performed in the reverse order, that is to say that the locations 12 could first be defined on the surface of the carrier 11 and the positions of the three points 16 could then be accurately defined in relation to the locations 12 by using a relationship of any kind between the locations 12 and the three fixed points 14.

In the next stage of the method according to the invention, the articles 10 to be mounted on the carrier 11 are brought to predetermined positions in relation to three fixed abutments 24. These abutments are carried for example by a plate in a positioning machine. These three abutments 24 define a second reference system and exactly correspond to the three fixed points 14 of the first reference system. In other words, the three fixed points 14 of the first reference system and the three abutments 24 of the second reference system can be exactly superimposed.

Similarly, the articles 10 which are in predetermined positions in relation to the abutments 24 occupy positions relative to these abutments which exactly correspond to the positions occupied by the locations 12 on the carrier 11 in relation to the fixed points 14, when the carrier 11 is in position shown in FIG. 2.

Figure 3:
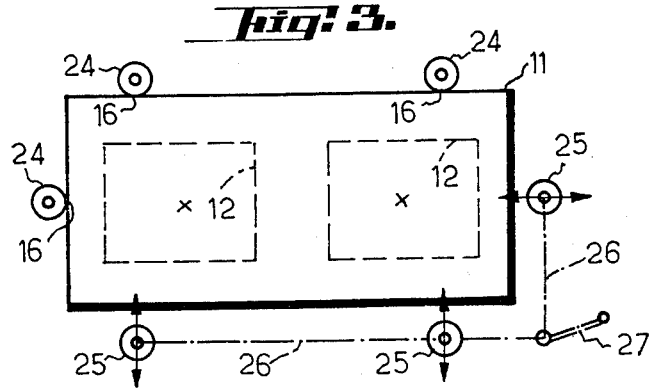
FIG. 3 is a schematic view of a second stage of the method according to the invention, consisting in setting up the carrier in relation to a second reference system so that the articles can be mounted at the proper location.

It should be apparent that, to be able to mount the articles 10 exactly at the predetermined locations 12 for them on the carrier 11, it is then merely necessary to bring the carrier 11 to the position shown in FIG. 3, i.e., with its lateral edges bearing against the three abutments 24 which define the second reference system. Thus, the points 16 on the carrier 11 at which the carrier bore against the fixed points 14 are also the points at which the carrier bears against the fixed abutments 24.

The articles 10 can then be laid down or mounted on and fitted to the carrier 11 in a manner well known in the art.

In effect, when the carrier 11 is pushed towards the fixed points 14 or towards the abutments 24, as indicated by the arrows 15 in FIG. 2, the edges of the carrier, which exhibit irregularities, rub to a greater or lesser degree against these fixed points or abutments. Depending upon the irregularities on the edges of the carrier, the frictional forces are greater or lesser in magnitude and there is a danger that they will hamper the displacement of the carrier. In addition, there is a danger of material being carried away or shifted at the edges of the carrier, which could detract from the accuracy with which the carrier is positioned in relation to the second reference system if the rubbing of the edge of the carrier against an abutment 24 resulted in material being carried away or built up at one of the points 16. Advantageously, in accordance with the present invention, the fixed points 14 and the abutments 24 are formed by exactly centered rollers which are mounted to be free to rotate without play about axes perpendicular to the plane of the carrier 11.

Using rotary rollers for the fixed points 14 and the abutments 24 enables the aforementioned disadvantages to be overcome.

Advantageously, it is also desirable to use such rotary rollers to form the means which enable the carrier 11 to be pushed into its predetermined position against the fixed points 14 or the abutments 24. Such rollers are shown in FIG. 3 and are indicated by reference numeral 25. Each roller 25 may be associated with a fixed abutment 24 and is movable towards and away from this abutment. The movement of the rollers 25 towards the corresponding abutments may be controlled by a mechanical linkage 26 associated with a common actuating lever 27. This lever may be moved manually or automatically.

It should be apparent that, when the rollers 25 are spaced the maximum distance away from their corresponding abutments 24, the carrier 11 can easily be positioned between the rollers 25 and the abutments 24. By operating the lever 27, the rollers 25 are urged towards their associated abutments 24 and push the carrier 11 against the abutments 24 and into the predetermined position.

When the carrier 11 is of square or rectangular shape, as shown in the drawings, it is enough for each reference system to be defined by three fixed points. On the other hand, when the carrier is of circular, oval or some other shape, it may be necessary to use more than three fixed points to define each reference system, certain of which fixed points may be associated with points on the lateral edges of the carrier while other fixed points in the reference system may be associated with specific points on the surface of the carrier.

It should be clearly understood that the invention is in no way restricted to the embodiment described and shown, which is given merely by way of example, but includes all variations thereof which come within the full scope and true spirit of the invention as defined in the appended claims.

We claim:

1. Apparatus for positioning electrical components relative to a carrier so that the articles can be laid down and attached at predetermined locations on the carrier comprises a first reference system defined by a first plurality of at least three fixed points, first means for bringing the carrier to position in relation to said first reference system such that lateral edges of the carrier come to bear against said first plurality of points, a second reference system defined by a second plurality of at least three fixed points, second means for defining on the carrier, when it is in said position, the locations for the articles to be laid down on the carrier, means for positioning the articles to be laid down in predetermined positions corresponding to the defined locations, and said second reference system being superimposed over said first reference system so as to enable the carrier to be positioned in relation to the said articles in such a way that the articles are then exactly opposite the defined locations for them on the carrier wherein the first means includes at least three rotatable abutments corresponding to the fixed points and being adapted to press the lateral edges of the carrier against the aforementioned fixed abutments.

2. Apparatus according to claim 1 wherein the rotatable abutments consist of accurately centered rollers, said rollers being mounted to be free to rotate without play about axes perpendicular to the plane of the carrier.

3. Apparatus according to claim 1 wherein the second reference system is absolutely identical to the first reference system, and is defined by fixed points identical to those of the first reference system and said means for replacing the articles to be laid down includes at least three rotatable abutments corresponding to the fixed points of the second reference system, said abutments being intended to press against the lateral edges of the carrier and position the articles to the predetermined positions.

4. Apparatus according to claim 1 wherein the second reference system is absolutely identical to the first reference system and is defined by fixed points identical to those of the first reference system.

5. Apparatus for positioning articles relative to a carrier so that articles can be laid down on the carrier and attached at predetermined locations on the carrier comprises a first reference system defined by at least three rotatable elements against which the lateral edges of the carrier come to bear, first means for bringing the carrier to a predetermined position in relation to said first reference system, a second reference system defined by at least three rotatable elements, second means for defining on the carrier, when it is in said predetermined position, the locations for the articles to be laid down, third means to bring the articles to be laid down to a predetermined position in relation to said second reference system, and said second reference system being disposed with respect to said first reference system so as to enable the carrier to be positioned in relation to the said articles in such a way that the articles are then exactly opposite the predetermined locations for them on the carrier.

6. Apparatus according to claim 5, wherein the said rotatable elements consist of accurately centered rollers, said rollers being mounted to be free to rotate without play about axes perpendicular to the plane of the carrier.

* * * * *

UNITED STATES PATENT AND TRADEMARK OFFICE
CERTIFICATE OF CORRECTION

PATENT NO. : 4,283,845
DATED : August 18, 1981
INVENTOR(S) : Pierre L SIGEL et al It is certified that error appears in the above-identified patent and that said Letters Patent are hereby corrected as shown below:

column 5, line 7, delete "replacing" and substitute --positioning--.

Signed and Sealed this

Twenty-ninth Day of December 1981

[SEAL]

Attest:

GERALD J. MOSSINGHOFF

Attesting Officer     Commissioner of Patents and Trademarks